United States Patent
Nicholls et al.

(10) Patent No.: US 7,085,970 B2
(45) Date of Patent: Aug. 1, 2006

(54) FAST DETECTION OF INCORRECT SAMPLING IN AN OVERSAMPLING CLOCK AND DATA RECOVERY SYSTEM

(75) Inventors: Gareth J. Nicholls, Brokenhurst (GB); Alexander H. Ainscow, Milton Keynes (GB); Jon D. Garlett, Wappingers Falls, NY (US); Bobak Modaress-Razavi, Morrisville, NC (US); Vernon R. Norman, Cary, NC (US); Martin L. Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 430 days.

(21) Appl. No.: 10/201,868

(22) Filed: Jul. 23, 2002

(65) Prior Publication Data

US 2004/0019837 A1    Jan. 29, 2004

(51) Int. Cl.
*H03M 13/00* (2006.01)
*G11B 27/00* (2006.01)
*H04L 7/00* (2006.01)

(52) U.S. Cl. ...................................... 714/709; 714/814
(58) Field of Classification Search ................ 714/709, 714/814; 375/361
See application file for complete search history.

(56) References Cited

U.S. PATENT DOCUMENTS

| | | | |
|---|---|---|---|
| 5,142,530 A | 8/1992 | Geyer et al. | |
| 5,297,869 A * | 3/1994 | Benham | 375/361 |
| 5,442,629 A | 8/1995 | Geyer et al. | |
| 2002/0009170 A1 | 1/2002 | Schmatz | |
| 2002/0095541 A1 | 7/2002 | Cranford, Jr. et al. | |
| 2002/0146084 A1 | 10/2002 | Cranford, Jr. et al. | |
| 2003/0128786 A1 | 7/2003 | Schmatz et al. | |
| 2004/0008762 A1 | 1/2004 | Garlett et al. | |
| 2004/0019837 A1 | 1/2004 | Nicholls et al. | |
| 2004/0066864 A1 | 4/2004 | Cranford, Jr et al. | |
| 2004/0066871 A1 | 4/2004 | Cranford, Jr. et al. | |
| 2004/0155687 A1 | 8/2004 | Lee et al. | |
| 2004/0170244 A1 | 9/2004 | Cranford, Jr. et al. | |
| 2004/0208270 A1 | 10/2004 | Schmatz et al. | |
| 2004/0218705 A1 | 11/2004 | Cranford, Jr. et al. | |
| 2004/0268190 A1 | 12/2004 | Kossel et al. | |
| 2005/0002475 A1 | 1/2005 | Menolfi et al. | |
| 2005/0076279 A1 | 4/2005 | Cranford, Jr. et al. | |
| 2005/0077936 A1 | 4/2005 | Cranford, Jr. et al. | |
| 2005/0111536 A1 | 5/2005 | Cranford, Jr. et al. | |
| 2005/0195863 A1 | 9/2005 | Cranford, Jr. et al. | |

\* cited by examiner

*Primary Examiner*—Albert Decady
*Assistant Examiner*—John J. Tabone, Jr.
(74) *Attorney, Agent, or Firm*—Joseph P. Abate

(57) ABSTRACT

A method, in an oversampling clock and data recovery system, for detecting that sampling is stuck taking place at a data edge, by detecting a data edge in an early or a late region relative to a good region and incrementing a stuck early or stuck late counter; and if one counter reaching a maximum, setting a condition indicating that sampling is stuck taking place at a data edge. If a data edge is detected in the good region, or in each of an early and a late region in a single data period, the stuck counters are reset to zero. The detection of which stuck counter has reached a maximum can cause the moving of a sampling clock forward or backward, ending when a data edge occurs in a good region, or in each of an early region and a late region in a single data period.

5 Claims, 4 Drawing Sheets

E = EARLY and ( not(STUCK) or SEC_ZERO )
L = LATE  and ( not(STUCK) or SLC_ZERO )
STUCK = STUCK_EARLY or STUCK_LATE /* Start of pseudo code fragment */

FOR EACH 3 data samples taken across a data bit period

Step 1
```
IF (middle sample is different from the previous edge sample)
    /* The clocks may be early */
    EARLY = true
ELSE
    EARLY = false
END IF
```

Step 2
```
IF (middle sample is different from the next edge sample)
    /* The clocks may be late */
    LATE = true
ELSE
    LATE = false
END IF
```

Step 3
```
IF (adjacent edge samples were different or (EARLY and LATE))
    /* The clocks may be good */
    GOOD = true
ELSE
    GOOD = false
END IF
```

Figure 2a

Step 4
```
IF (EARLY and (not(STUCK) or STUCK_EARLY_COUNT is zero))
    STUCK_EARLY_COUNT = STUCK_EARLY_COUNT + 1
END IF
```

Step 5
```
IF (LATE and (not(STUCK) or STUCK_LATE_COUNT is zero))
    STUCK_LATE_COUNT = STUCK_LATE_COUNT + 1
END IF
```

Step 6
```
IF (GOOD)
    STUCK_EARLY_COUNT = 0
    STUCK_LATE_COUNT = 0
END IF
```

Step 7
```
IF (STUCK_EARLY_COUNT >= STUCK_COUNT_LIMIT
    and STUCK_LATE_COUNT is not zero)
    STUCK_EARLY = true
ELSE
    STUCK_EARLY = false
END IF
```

Step 8
```
IF (STUCK_LATE_COUNT >= STUCK_COUNT_LIMIT
    and STUCK_EARLY_COUNT is not zero)
    STUCK_LATE = true
ELSE
    STUCK_LATE = false
END IF
```

Step 9
```
STUCK = STUCK_EARLY or STUCK_LATE
```

Step 10
```
IF (STUCK_EARLY)
    make the sampling clock a lot later
ELSE IF (STUCK_LATE)
    make the sampling clock a lot earlier
ELSE IF (the number of clock earlies has been significantly
         more than the number of clock lates)
    make the sampling clock a little bit later
ELSE IF (the number of clock lates has been significantly
         more than the number of clock earlies)
    make the sampling clock a little bit earlier
ELSE
    leave the sampling clock where it is
ENDIF
```

NEXT 3 data samples

/* End of pseudo code fragment */

Figure 2b

Block diagram of Stuck detection

FAST DETECTION OF INCORRECT SAMPLING IN AN OVERSAMPLING CLOCK AND DATA RECOVERY SYSTEM

FIELD OF THE INVENTION

The present invention relates to the field of clock and data recovery systems, and more particularly to the detection that a false lock is causing data sampling to be stuck taking place at a data edge rather than at a position central to the data.

BACKGROUND OF THE INVENTION

In an oversampling Clock and Data Recovery (CDR) system in which oversampling is more than twofold, two of the sampling clocks are positioned on each side of the average position of data edges in the serial input data by incrementing and decrementing the clock position to balance indications of late clocks and early clocks from the oversampling of the input stream. A lock is achieved when the clock position follows the average position of the data edge. The data is then preferably used from a sample made as centrally as possible between the noisy data edge positions. Two possible lock positions can be made. The CDR is "in lock" when the data is sampled centrally between the noisy data edge positions, but there is also an undesirable lock where the data sample is made in the middle of the noisy data edge position (a "false lock").

Many phase locked control loops exhibit both the desirable stabel equilibrium position when the CDR is in lock and the unstable equilibrium condition, or false lock, when the CDR is 180° out of lock and is stuck sampling the data edge. In this unstable equilibrium condition it can take a significant amount of time for the instability to grow sufficiently for the phase locked loop to move to the proper in lock condition.

Conventionally the system is allowed to settle into a lock using the same method used to follow the average data edge position. This can cause a false lock for an underlying long time.

The conventional methods and apparatus of the prior art thus cannot prevent an oversampling clock and data recover system from attaining such a false lock and settling into a position in which sampling is stuck for an extended period in a position in which it is taking place at a data edge.

SUMMARY OF THE INVENTION

The present invention accordingly provides a method, in an oversampling clock and data recovery system, for detecting that sampling is stuck taking place at a data edge. The method includes the steps of: detecting a data edge in an early region or a late region relative to a good region; responsive to said step of detecting, incrementing at least one of a stuck early counter when the data edge is early and a stuck late counter when the data edge is late and resetting the stuck late counter and the stuck early counter when the data edge is in a good position; and responsive to a first one or both of said stuck early counter or said stuck late counter reaching a maximum, setting a condition indicating that sampling is stuck taking place at the data edge.

The method of a preferred embodiment of the present invention can detect a false lock, where sampling is stuck taking place at a data edge, without any prior indication that such a condition may be encountered. The method also speeds up normal locking by detecting conditions near a false lock, then moving a sampling clock to a condition near an in lock condition.

The solution provided by the preferred embodiment of the present invention can detect when a false lock occurs by checking the position of the edges, and can then adjust the sampling position by moving a sampling clock, in the correct direction, to a position where the normal method can reliably attain lock, and thus begin sampling at a position central to the data.

BRIEF DESCRIPTION OF THE DRAWINGS

A preferred embodiment of the present invention will now be described, by way of example only, with reference to the accompanying drawings, in which:

FIG. 2a shows a pseudo-code representation of a first portion of a method according to a preferred embodiment of the present invention.

FIG. 2b shows a pseudo-code representation of a second portion of a method according to a preferred embodiment of the present invention.

DETAILED DESCRIPTION OF THE INVENTION

Under an in lock condition the data edges will be largely between two sample positions. This is the "good" region. The region between the data sample position and the following edge sample position is known as "late" because the clock may be late if a data edge occurs in this region. The region between the data sample position and the previous edge sample is known as "early" because the clock may be early if a data edge occurs in this region. During an in lock condition there will be some data edges in Early and Late but most data edges will be in the "Good" region. During a false lock most data edges will be in the Early/Late positions with very few in the good region and the data will be being sampled at a data edge rather than a position central to the data. The method of a preferred embodiment of the present invention detects a false lock by looking for a series of edges in the Early/Late regions. In a most preferred embodiment a false lock is detected if there are a set number of consecutive Early/Late signals, with at least one signal being detected in each of Early and Late. This second condition is to stop a false lock being wrongly detected due to conditions such as large Sinusoidal Jitter, which may cause runs of edges in just the Early or just the Late region. The set number of consecutive Early/Late signals may be varied according to the type of data, the characteristics required of the detector, the type of noise expected in the system and the like, as will be clear to one skilled in the art. Preferably, the number will be set such that the probability of detecting an apparent false lock when there is none is suitably small.

Figure 1:
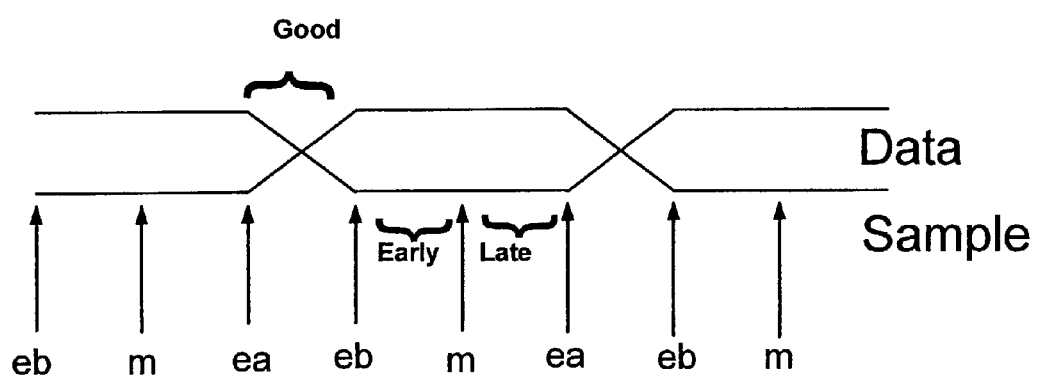
FIG. 1 shows a latch arrangement of a preferred embodiment of the present invention relative to a flow of data for the threefold oversampling case.
Figure 3:
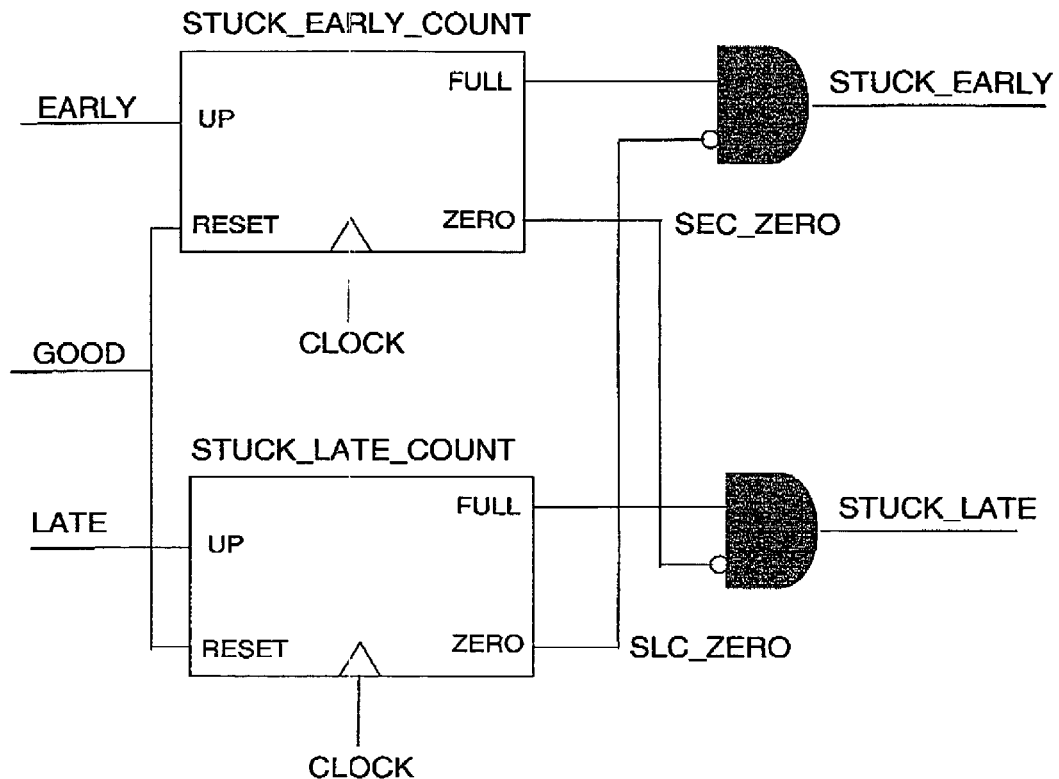
FIG. 3 shows a schematic block circuit diagram of a stuck detection circuit according to a preferred embodiment of the present invention.

Referring now to FIG. 1, m is the data sample that should occur in the middle of the data "middle sample" when in lock; eb is the data sample that should occur near the data edge before the middle sample when in lock; and ea is the data sample that should occur near the data edge after the middle sample when in lock. By placing an XOR gate between each successive pair of data samples, a signal is generated that will be high if the clock is early, a signal high if the clock is late and a signal high if the clock position is good.

Turning to FIG. 2a, pseudo-code is shown which, for each of three data samples, tests at steps 1, 2 and 3 for conditions EARLY, LATE OR GOOD.

Continuing at FIG. 2b, pseudo-code is shown which continues the sequence by testing at step 4 for an EARLY condition when either STUCK is false or the STUCK_EARLY_COUNT is zero and responding by incrementing the STUCK_EARLY_COUNT. Step 5 tests and responds in the equivalent way for a LATE condition.

At step 6, a GOOD condition causes both counters to be reset to zero. Steps 7 and 8 test for either of the STUCK_EARLY and STUCK_LATE counters reaching a maximum value, and responding by setting the appropriate condition. Step 9 tests for either of the stuck (EARLY or LATE) conditions and sets a STUCK flag.

Step 10 consists of a series of tests and comparisons to determine whether the sampling clock should be moved or not, and, if it should be moved, determining whether it should be moved by a large or small amount and in which direction. The tests are for the STUCK_EARLY and STUCK_LATE conditions, to determine if the sampling clock should be moved to a significantly later or earlier position. The comparisons are carried out between the counters to determine if a smaller movement of the sampling clock to an earlier or later position is indicated. If sampling is to be moved to a significantly earlier or later position, the clock position can be moved by up to half a data period.

A CDR according to the prior art can become stuck sampling at the data edge because there are not significantly more early clock or late clock indications often enough to move it towards lock and when the sampling clock is moved it can be moved in the wrong direction.

When the CDR is locked most of the data edges will occur in between the edge samples (the good region) with some edges occurring between the middle sample and the previous edge sample (the early region) and some edges occurring in between the middle sample and the next edge sample (the late region). The STUCK_EARLY_COUNT and STUCK_LATE_COUNT will not get very large because they are frequently reset when there is an edge in the good region or if there has been a narrow data pulse with an edge in the early region at the same time as an edge in the late region. However if there is a component of timing jitter between the data and clock that is high enough in frequency that the CDR should not follow it then the majority of data edges could move out of the good region and into the early region on the peak of the jitter, and then back through the good region and into the late region on the trough of the jitter. There will be very few transitions in the late region when high frequency jitter is causing the majority of transitions to be in the early region (unless it is so large that the CDR phase locked loop could not cope with it anyway). So STUCK will not be detected if STUCK_EARLY_COUNT reaches the limit and STUCK_LATE_COUNT is still zero. Similarly STUCK will not be detected if STUCK_LATE_COUNT reaches the limit and STUCK_EARLY_COUNT is still zero. This will stop high frequency timing jitter from causing false detection.

The STUCK_COUNT_LIMIT is set such that the probability of detecting "stuck" when the loop is correctly locked is sufficiently low.

When the CDR is stuck sampling at the data edge there will be many edges occurring in the early and late region and very few in the good region so that the stuck counters will quickly leave zero and one will reach the limit without being reset. Medium frequency timing jitter can cause periods of time with more transition in the good region but it will also make the CDR less likely to get stuck. An offset between the sampling clock period and the data clock period will also tend to stop the CDR from getting stuck.

The system of the preferred embodiment can be easily modified so that it works with 6 samples over 2 data bit periods or 12 samples over 4 data bits etc., so that the logic can operate at a clock frequency which is less that the received data rate.

In a most preferred embodiment, if either counter reaches its maximum while the other counter is not zero then an incorrect lock has been detected, indicating that sampling is stuck taking place at the edge of the data. The sampling clock may then most suitably be moved in a direction determined by the identification of the counter that has reached its maximum. If both counters reach the maximum then it does not matter in which direction the sampling clock is moved.

Embodiments of the present invention may be embodied as hardware logic in a circuit, or alternatively it may be embodied in a hardware description language.

Alternatively, the present invention may be embodied as a software computer program product for use with a computer system. Such an implementation may comprise a series of computer readable instructions either fixed on a tangible medium, such as a computer readable medium, e.g., diskette, CD-ROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, e.g., shrink wrapped software, pre-loaded with a computer system, e.g., on a system ROM or fixed disk, or distributed from a server or electronic bulletin board over a network, e.g., the Internet or World Wide Web.

Thus, the preferred embodiments of the present invention advantageously provide a way to achieve an in lock condition in an oversampling clock and data recovery system by detecting a predominance of data edges in the early and late regions with relatively few data edges in the good region. The preferred embodiments further advantageously avoid incorrect detection of an apparent false lock condition when none exists.

What is claimed is:

1. A method, in an oversampling clock and data recovery system, for detecting that sampling is stuck taking place at a data edge, the method comprising the steps of:
    detecting a data edge in an early region or a late region relative to a good region;
    responsive to said step of detecting, incrementing a stuck early counter when the data edge is early and incrementing a stuck late counter when the data edge is late, and resetting the stuck late counter and stuck early counter when the data edge is in a good position; and responsive to one of said stuck early counter or said stuck late counter reaching a maximum, setting a condition indicating that sampling is stuck taking place at the data edge.

2. The method of claim 1, further comprising the step of:

prior to said step of setting a condition, determining that at least one signal has been detected in each of said early region and said late region.

3. A computer program product comprising computer readable code embodied in a computer readable medium to, when loaded into a computer system and executed, causes said computer system to carry out all the steps of a method, in an oversampling clock and data recovery system, for detecting that sampling is stuck taking place at a data edge, the computer program product comprising program code means for:

detecting a data edge in an early region or a late region relative to a good region;

incrementing a stuck early counter when the data edge is early and incrementing a stuck late counter when the data edge is late; and resetting the stuck late counter and stuck early counter when the data edge is in a good position; and responsive to one of said stuck early counter end or said stuck late counter reaching a maximum, setting a condition indicating that sampling is stuck taking place at the data edge.

4. The computer program product of claim 3, further comprising program code means, operable prior to said program code means for setting a condition indicating that sampling is stuck taking place at a data edge, for:

determining that at least one signal has been detected in each of said early region and said late region.

5. A detector apparatus for detecting that sampling is stuck taking place at a data edge in an oversampling clock and data recovery system, comprising:

means for detecting a data edge in an early region or a late region relative to a good region;

means, responsive to said means for detecting, for incrementing a stuck early counter when the data edge is early and incrementing a stuck late counter when the data edge is late, and resetting the stuck late counter and the stuck early counter when the data edge is in a good position; and means, responsive to one of said stuck early counter or said stuck late counter reaching a maximum, for setting a condition indicating that sampling is stuck taking place at the data edge.

* * * * *